(12) United States Patent
Matsumoto et al.

(10) Patent No.: US 8,309,959 B2
(45) Date of Patent: Nov. 13, 2012

(54) DISPLAY DEVICE HAVING OPENING PORTION WITH DIFFERENT WIDTHS

(75) Inventors: Jun Matsumoto, Mobara (JP); Kazushi Yamamoto, Mobara (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 765 days.

(21) Appl. No.: 12/473,303

(22) Filed: May 28, 2009

(65) Prior Publication Data

US 2009/0295701 A1 Dec. 3, 2009

(30) Foreign Application Priority Data

May 28, 2008 (JP) ................................. 2008-140188

(51) Int. Cl.
*H01L 29/417* (2006.01)
(52) U.S. Cl. ...................... 257/59; 257/E29.117; 345/92
(58) Field of Classification Search .................... 257/59, 257/72, E29.117; 345/92
See application file for complete search history.

(56) References Cited

U.S. PATENT DOCUMENTS

2008/0210941 A1* 9/2008 Watanabe et al. ............... 257/59

FOREIGN PATENT DOCUMENTS

JP 09-258244 10/1997

* cited by examiner

*Primary Examiner* — Wensing Kuo
(74) *Attorney, Agent, or Firm* — Antonelli, Terry, Stout & Kraus, LLP.

(57) ABSTRACT

A display device which surely allows the black-spot-forming correction at the time of forming an opening portion in a portion of a scanning signal line where a scanning signal line and a video signal line intersects each other and forming a semiconductor layer and a conductor layer by a resist flow method is provided. A scanning signal line which forms an opening portion in a portion thereof which intersects a video signal line, an insulation film, a semiconductor layer which covers a region which spreads larger than a conductor layer, and the conductor layer are sequentially stacked. The conductor layer includes the video signal line, a drain electrode and a source electrode of a thin film transistor, and a connecting line which connects the video signal line and the drain electrode. The connecting line is branched from the video signal line over the opening portion, and the opening portions is formed in a projecting manner toward both edges of the scanning signal line such that a width of the opening portion in the direction which intersects the connecting line is set larger than a width of the semiconductor layer.

1 Claim, 11 Drawing Sheets

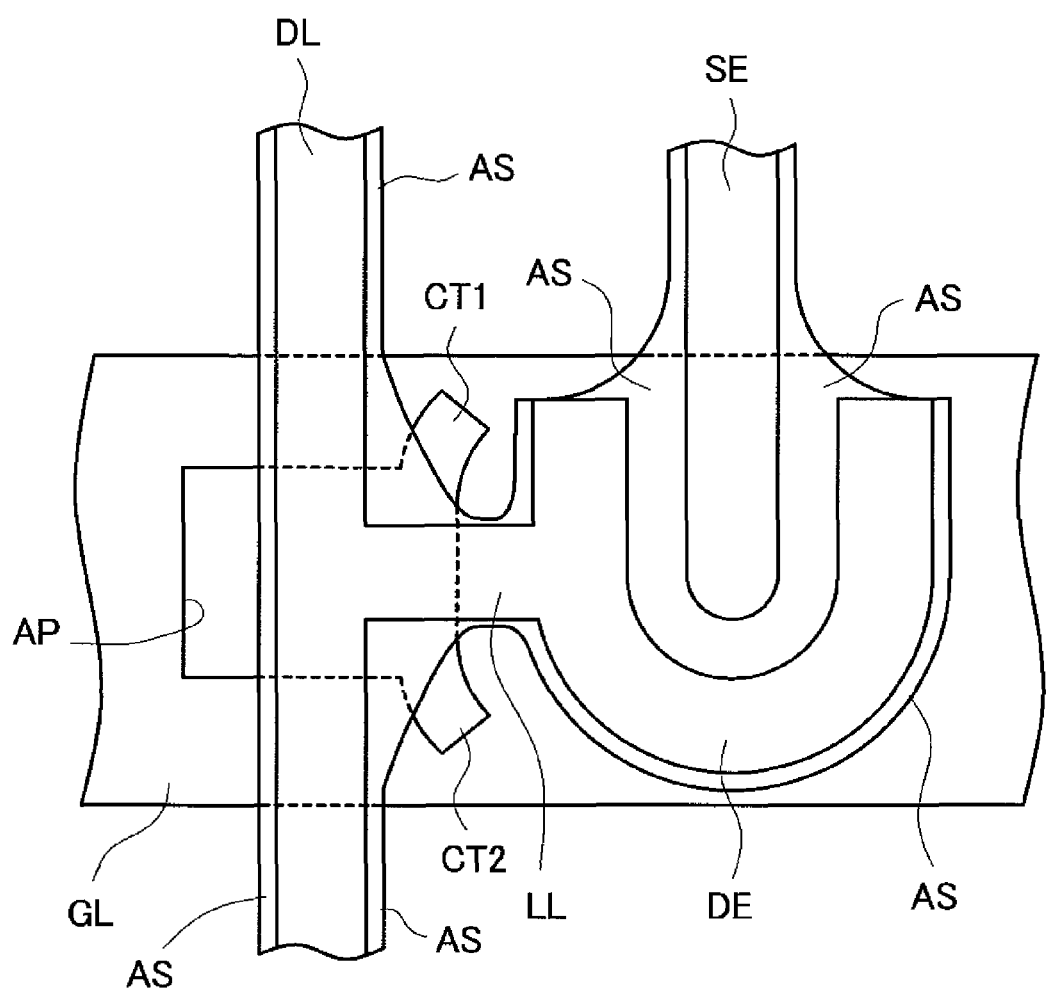

DISPLAY DEVICE HAVING OPENING PORTION WITH DIFFERENT WIDTHS

The present application claims priority from Japanese application JP2008-140188 filed on May 28, 2008, the content of which is hereby incorporated by reference into this application.

BACKGROUND OF THE INVENTION

1. Field of the Invention

The present invention relates to a display device which performs a display control of pixels using thin film transistors (TFTs) and a manufacturing method thereof.

2. Description of the Related Art

For example, among various display devices including a liquid crystal display device, there has been known a display device which performs a display control of respective pixels by an active matrix drive method using thin film transistors. In such a display device, a plurality of scanning signal lines and a plurality of video signal lines are arranged on a substrate (hereinafter, referred to as a TFT substrate) in a stereoscopically intersecting manner. Here, respective intersecting points of the scanning signal lines and the video signal lines correspond to the pixels of the display device. A portion of the scanning signal line functions as a gate electrode of the thin film transistor, and either one of a drain electrode and a source electrode (the drain electrode in the explanation made hereinafter) of the thin film transistor is connected to the video signal line. Further, a pixel electrode is connected to the electrode of the thin film transistor which is not connected to the video signal line (source electrode in the explanation made hereinafter). Due to such constitution, by applying voltages to both of the scanning signal line and the video signal line corresponding to the pixel to which a display control is applied, the voltages are applied to the corresponding pixel electrode via the thin film transistor which functions as a switching element so that a display control of the pixel can be performed.

To form such a thin film transistor, it is necessary to stack the scanning signal lines, an insulation film, a semiconductor layer, and a conductor layer on the TFT substrate in this order. Here, the conductor layer is a layer which includes the video signal lines, the drain electrodes and the source electrodes. To form these scanning signal lines, a semiconductor layer and a conductor layer having desired patterns respectively on the TFT substrate, a so-called photolithography technique can be used. According to this technique, a resist material is applied to a surface of a material film for forming these parts by coating, the resist material is processed in a pattern of these parts to be formed by exposure and development, and the material film for forming these parts is etched using the processed resist material as a mask thus forming the scanning signal lines, the semiconductor layer and the conductor layer having desired patterns.

Further, in forming the semiconductor layers and the conductor layers by performing exposure one time, a resist reflow method may be adopted (see JP-A-2002-90779 (corresponding U.S. Pat. No. 6,933,989B2) (patent document 1), for example). In this method, a material film for forming a semiconductor and a material film for forming a conductor are sequentially stacked on a TFT substrate on which scanning signal lines and an insulation film are formed, the material film for forming the conductor is formed into conductor layers of a desired pattern by the above-mentioned technique and, thereafter, a resist material remaining on the conductor layers is melted. Due to such steps, the resist material covers a region which is larger than a region on which the conductor layer is formed. By further etching the material film for forming the semiconductor using the spread resist material as a mask, the semiconductor layers are formed into a shape which includes a region where the conductor layer is formed without exposing the resist material.

Further, in a display device having the above-mentioned type of thin film transistor, an opening portion may be formed in a portion of a scanning signal line where the scanning signal line intersects the video signal line (see JP-A-9-258244 (patent document 2), for example). By forming the opening portion in the scanning signal line, the scanning signal line is bifurcated at the portion where the opening portion is formed so that, as viewed in a plan view, the respective branched or bifurcated scanning signal lines intersect with the video signal line. Due to such constitution, when the scanning signal line and the video signal line are short-circuited with each other at a portion of an intersecting portion during a manufacturing process by a chance, by cutting one scanning signal line out of these bifurcated or branched scanning signal lines, it is possible to cut off only the portion which is short-circuited with the video signal line from the whole scanning signal line.

Further, as described in patent document 2, a connecting line which connects the video signal line and the drain electrode of the thin film transistor may be formed such that the connecting line is branched from the video signal line above the opening portion. Due to such constitution, when it is necessary to correct a certain pixel, it is possible to separate the video signal line and the thin film transistor from each other by cutting the connecting line which connects the drain electrode of the thin film transistor corresponding to the pixel and the video signal line above the opening portion. Accordingly, in case of pixels which are operated in a normally black mode, it is possible to fix liquid crystal at a state which interrupts light (black spot forming).

SUMMARY OF THE INVENTION

As described above, when the opening portion is formed in the portion of the scanning signal line where the scanning signal line and the video signal line intersect with each other, and the semiconductor layer and the conductor layer are formed by a resist reflow method, the semiconductor layer is formed so as to cover a region which is larger than the conductor layer. Further, due to an action such as a surface tension which is generated when the resist material is melted, at a portion where the conductor layer exhibits an approximately acute-angled pattern such as a portion where the connecting line is branched from the video signal line, the resist material is liable to easily gather compared to other portions and hence, the semiconductor layer is liable to be easily formed in a wide range. Accordingly, when the semiconductor layer is formed so as to close the opening portion, there may be a case where it is difficult to perform the above-mentioned correction of the black spot where the connecting line is cut off at the opening portion or the above-mentioned correction which cuts off the scanning signal line which is short-circuited with the video signal line out of the scanning signal lines bifurcated or branched by the opening portion.

FIG. 12 is a partial plan view of a TFT substrate TS showing the structure of a peripheral portion of a thin film transistor in a state that an opening portion is closed in the above-mentioned manner. FIG. 12 shows the positional relationship among a scanning signal line GL in which the opening portion AP is formed, a semiconductor layer AS, a video signal line DL, a drain electrode DE and a source electrode SE of a thin film transistor T, and a connecting line LL which connects the drain electrode DE and the video signal line DL with each other, wherein all of these components are formed on the TFT substrate. For example, in performing the correction of a black spot (in separating the video signal line DL and the drain electrode DE), it is necessary to cut off the connecting line LL including the semiconductor layer AS. Accordingly, it is necessary to perform cutting using laser beams or the like by setting positions in the inside of the opening portion AP where the semiconductor layer AS is not formed as a start point and a finish point. In this respect, as shown in FIG. 12, when the semiconductor layer AS is formed so wide to occupy a most region of the opening portion AP on a side where a portion of the connecting line LL which advances into the opening portion AP (a portion indicated by symbol P in the drawing) is arranged (a portion on a right side of the video signal line DL in the direction toward the paper plane of the drawing), the spatial tolerance for cutting the connecting line LL including the semiconductor layer AS cannot be ensured in the inside of the opening portion AP. That is, in the example shown in FIG. 12, on the side where the connecting line LL advances into the opening portion AP, a portion where a width W1 of the opening portion AP in the direction which intersects the connecting line LL is set larger than a width W2 of the semiconductor layer AS in the same direction is extremely small in area and hence, there is no spatial tolerance for cutting the connecting line LL. In the same manner, it is difficult to sufficiently ensure the spatial tolerance in the inside of the opening portion AP when one scanning signal line GL which is short-circuited with the video signal line DL is cut off out of the scanning signal lines GL which are bifurcated or branched by the opening portion AP.

As one of methods for overcoming such a drawback, a size of the opening portion AP may be increased along the direction that the scanning signal line GL extends to a position at which the opening portion AP is not influenced by the resist material which spreads from the video signal line DL. However, when a size of the opening portion AP is increased in the direction that the scanning signal line GL extends in this manner, electric resistance of the scanning signal line GL is increased corresponding to the increase of the size of the opening portion AP. Further, a distance between the video signal line DL and the thin film transistor T is increased and hence, the limitation is imposed on the reduction of area per one pixel whereby the enhancement of high resolution of the whole display device is impeded.

The present invention has been made in view of the above-mentioned circumstances, and it is an object of the present invention to provide a display device which can, in forming an opening portion in a portion of a scanning signal line where the scanning signal line intersects a video signal line and forming a semiconductor layer and a conductor layer by a resist reflow method, ensure a repair which cuts off a connecting line for connecting a drain electrode or a source electrode of a thin film transistor with a video signal line in the inside of the opening portion or a repair which cuts off one of scanning signal lines bifurcated or branched by the opening portion, for example, and a manufacturing method of the display device.

To overcome the above-mentioned drawbacks, according to one aspect of the present invention, there is provided a display device in which scanning signal lines, an insulation film, semiconductor layers, and conductor layers are sequentially stacked on a substrate, wherein the conductor layer includes a video signal line which intersects the scanning signal line as viewed in a plan view, a drain electrode and a source electrode of a thin film transistor, and a connecting line which connects the video signal line and either one of the drain electrode and the source electrode, the semiconductor layer is formed so as to cover a region of the insulation film which is larger than a region where the conductor layer is formed as viewed in a plan view, an opening portion which partially overlaps with the video signal line as viewed in a plan view is formed in the scanning signal line, the connecting line is branched from the video signal line over the opening portion, and extends to the outside of the opening portion, and the opening portion is formed in a projecting manner toward both edges of the scanning signal line such that, as viewed in a plan view, a width of the opening portion in the direction which intersects the connecting line is set larger than a width of the semiconductor layer which expands toward an outer side of the connecting line.

According to another aspect of the present invention, there is provided a manufacturing method of a display device which includes: a step in which, in a state where a film made of a material for forming scanning signal lines and a film made of a resist material are sequentially stacked on a substrate, the resist material is formed in a pattern corresponding to a shape of the scanning signal lines to be formed, and the material for forming the scanning signal lines is etched using the formed resist material as a mask thus forming the scanning signal lines each of which forms an opening portion therein; a step in which an insulation film is formed on the substrate on which the scanning signal lines are formed; a step in which, in a state where a film made of a material for forming semiconductor layers, a film made of a material for forming conductor layers and a film made of a resist material are sequentially stacked on the substrate on which the scanning signal lines and the insulation film are formed, the resist material is formed in a pattern corresponding to a shape of the conductor layers to be formed, and the material for forming the conductor layers is etched using the formed resist material as a mask thus forming the conductor layers which include video signal lines each of which intersects the scanning signal line over the opening portion as viewed in a plan view, drain electrodes and source electrodes of thin film transistors, and connecting lines each of which connects the video signal line and either one of the drain electrode and the source electrode; and a step in which, after the formation of the conductor layers, the resist material which remains on the conductor layers is melted, the material for forming the semiconductor layers is etched using the melted resist material as a mask thus forming the semiconductor layers each of which covers a region larger than a region of the insulation film where the conductor layer is formed as viewed in a plan view, wherein the connecting lines are formed such that each connecting line is branched from the video signal line over the opening portion, and extends to the outside of the opening portion, and the opening portion is formed in a projecting manner toward both edges of the scanning signal line such that, as viewed in a plan view, a width of the opening portion in the direction which intersects the connecting line is set larger than a width of a region where the resist material remaining on the video signal line and the connecting line spreads at the time of forming the semiconductor layer.

According to still another aspect of the present invention, there is provided a display device in which scanning signal lines, an insulation film, semiconductor layers, and conductor layers are sequentially stacked on a substrate, wherein the conductor layer includes a video signal line which intersects the scanning signal line as viewed in a plan view, a drain electrode and a source electrode of a thin film transistor, and a connecting line which connects the video signal line and either one of the drain electrode and the source electrode, the semiconductor layer is formed so as to cover a region of the insulation film which is larger than a region where the conductor layer is formed as viewed in a plan view, an opening portion which partially overlaps with the video signal line as viewed in a plan view is formed in the scanning signal line, the connecting line is branched from the video signal line over the opening portion, and extends to the outside of the opening portion, and the opening portion is formed such that, as viewed in a plan view, a width of the opening portion in the direction which intersects the connecting line is narrowed once and is expanded again thereafter corresponding to the increase of a distance from the video signal line toward a side where the connecting lines advances into the opening portion.

According to still another aspect of the present invention, there is provided a manufacturing method of a display device which includes: a step in which, in a state where a film made of a material for forming scanning signal lines and a film made of a resist film are sequentially stacked on a substrate, the resist material is formed in a pattern corresponding to a shape of the scanning signal lines to be formed, and the material for forming the scanning signal lines is etched using the formed resist material as a mask thus forming the scanning signal lines each of which forms an opening portion therein; a step in which an insulation film is formed on the substrate on which the scanning signal lines are formed; a step in which, in a state where a film made of a material for forming semiconductor layers, a film made of a material for forming conductor layers and a film made of a resist material are sequentially stacked on the substrate on which the scanning signal lines and the insulation film are formed, the resist material is formed in a pattern corresponding to a shape of the conductor layers to be formed, and the material for forming the conductor layers is etched using the formed resist material as a mask thus forming the conductor layers which include video signal lines each of which intersects the scanning signal line over the opening portion as viewed in a plan view, drain electrodes and source electrodes of thin film transistors, connecting lines each of which connects the video signal line and either one of the drain electrode and the source electrode; and a step in which, after the formation of the conductor layers, the resist material which remains on the conductor layers is melted, and the material for forming the semiconductor layers is etched using the melted resist material as a mask thus forming the semiconductor layers each of which covers a region larger than a region of the insulation film where the conductor layer is formed as viewed in a plan view, wherein the connecting lines are formed such that each connecting line is branched from the video signal line over the opening portion, and extends to the outside of the opening portion, and the opening portion is formed such that, as viewed in a plan view, a width of the opening portion in the direction which intersects the connecting line is narrowed once and is expanded again thereafter corresponding to the increase of a distance from the video signal line toward a side where the connecting line advances into the opening portion, and a region where the width of the opening portion in the direction which intersects the connecting line is narrowed suppresses the spreading of the resist material remaining on the video signal line and the connecting line at the time of forming the semiconductor layer.

BRIEF DESCRIPTION OF THE DRAWINGS

FIG. 7 is a view showing another example of a shape of an opening portion of the display device according to the first embodiment of the present invention;

DESCRIPTION OF THE PREFERRED EMBODIMENTS

Hereinafter, embodiments of the present invention are explained in conjunction with drawings.

First of all, a display device of the first embodiment according to the present invention is a liquid crystal display device which includes a TFT substrate on which scanning signal lines, video signal lines, thin film transistors, pixel electrodes and common electrodes are mounted, a filter substrate which faces the TFT substrate in an opposed manner and on which color filters are mounted, and a liquid crystal material which is hermetically filled into a region sandwiched between the TFT substrate and the filter substrate. Both of the TFT substrate and the filter substrate are formed of a glass substrate or the like.

Figure 1:
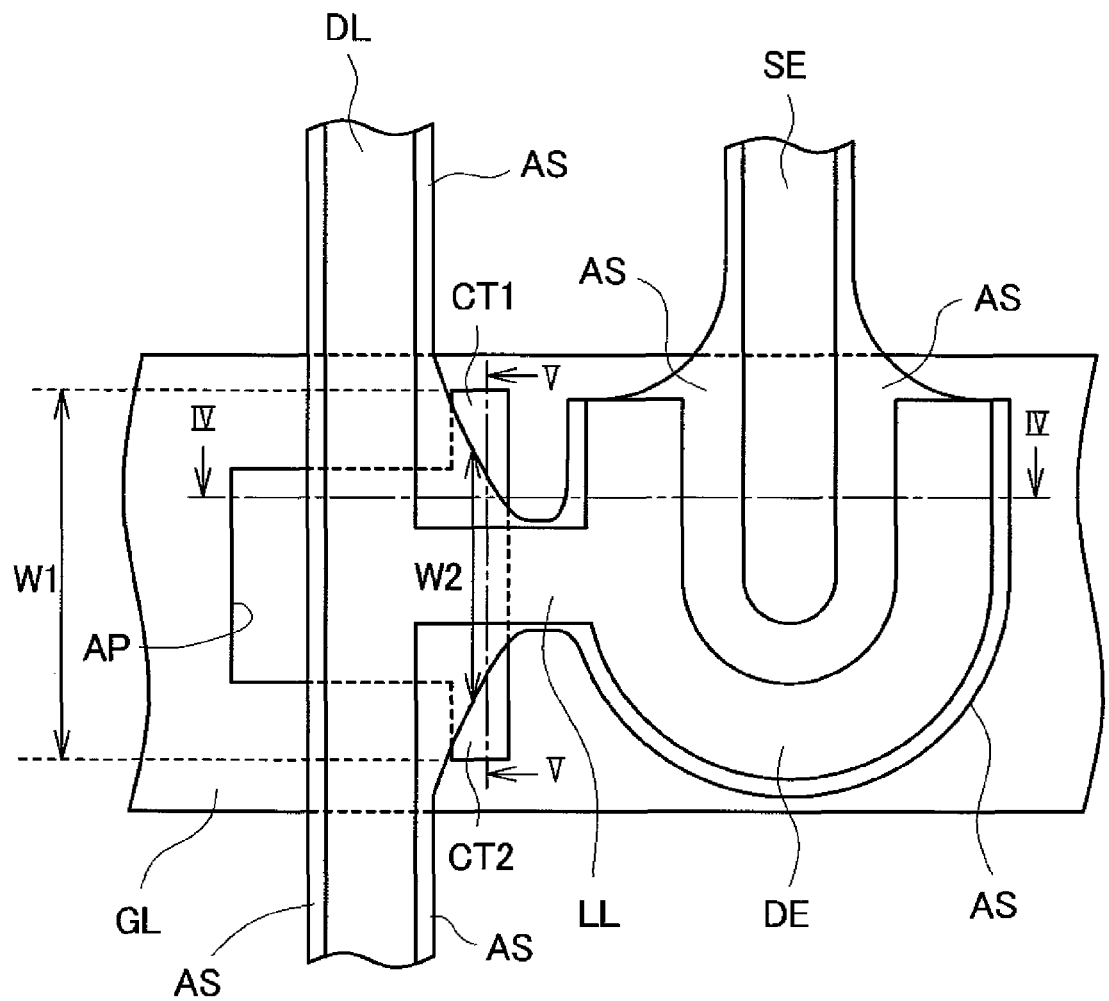
FIG. 1 is a partial plan view of a TFT substrate of a display device according to a first embodiment of the present invention.
Figure 2:
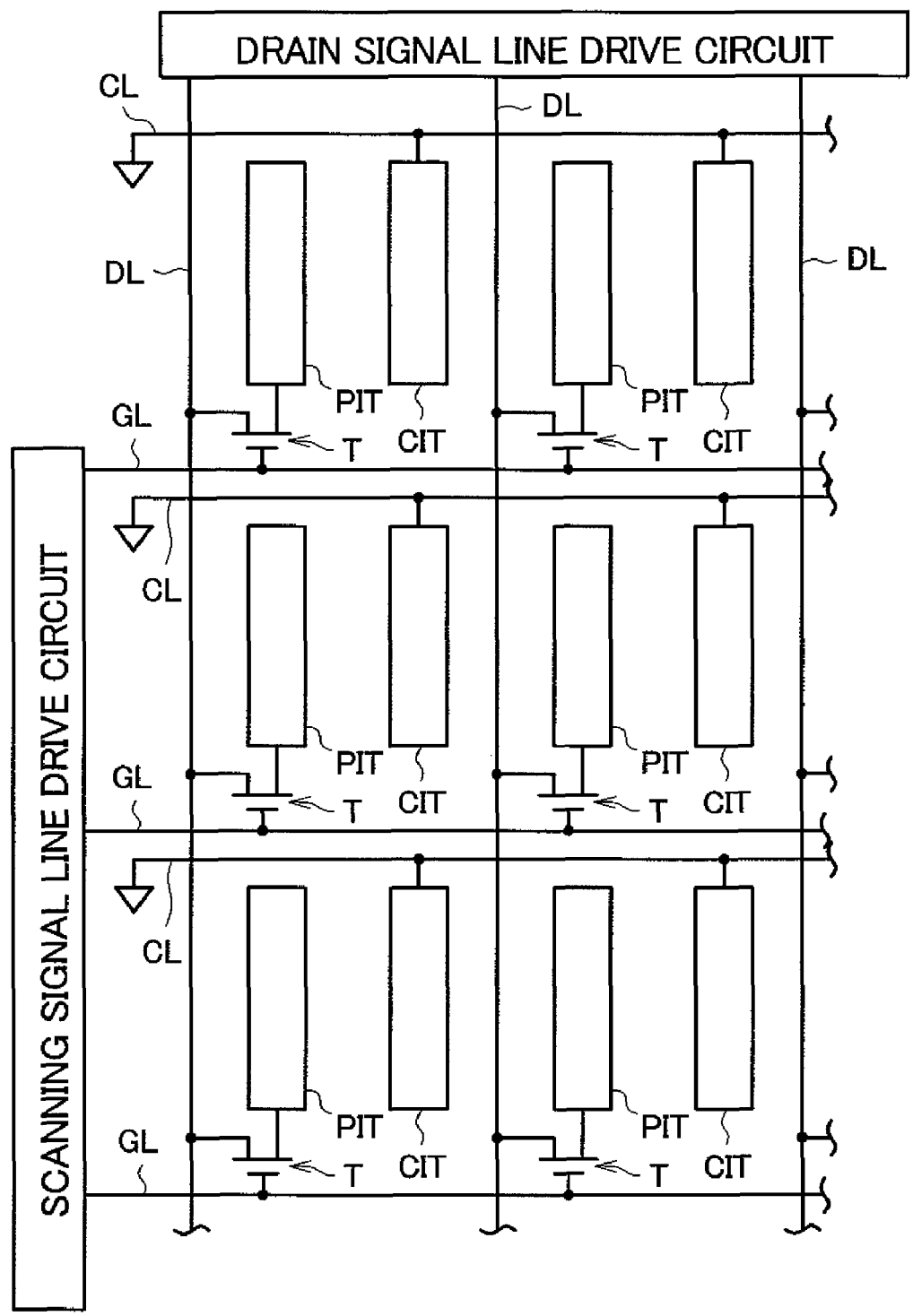
FIG. 2 is a circuit diagram showing a portion of the circuit constitution of the display device according to the first embodiment of the present invention.
Figure 3:
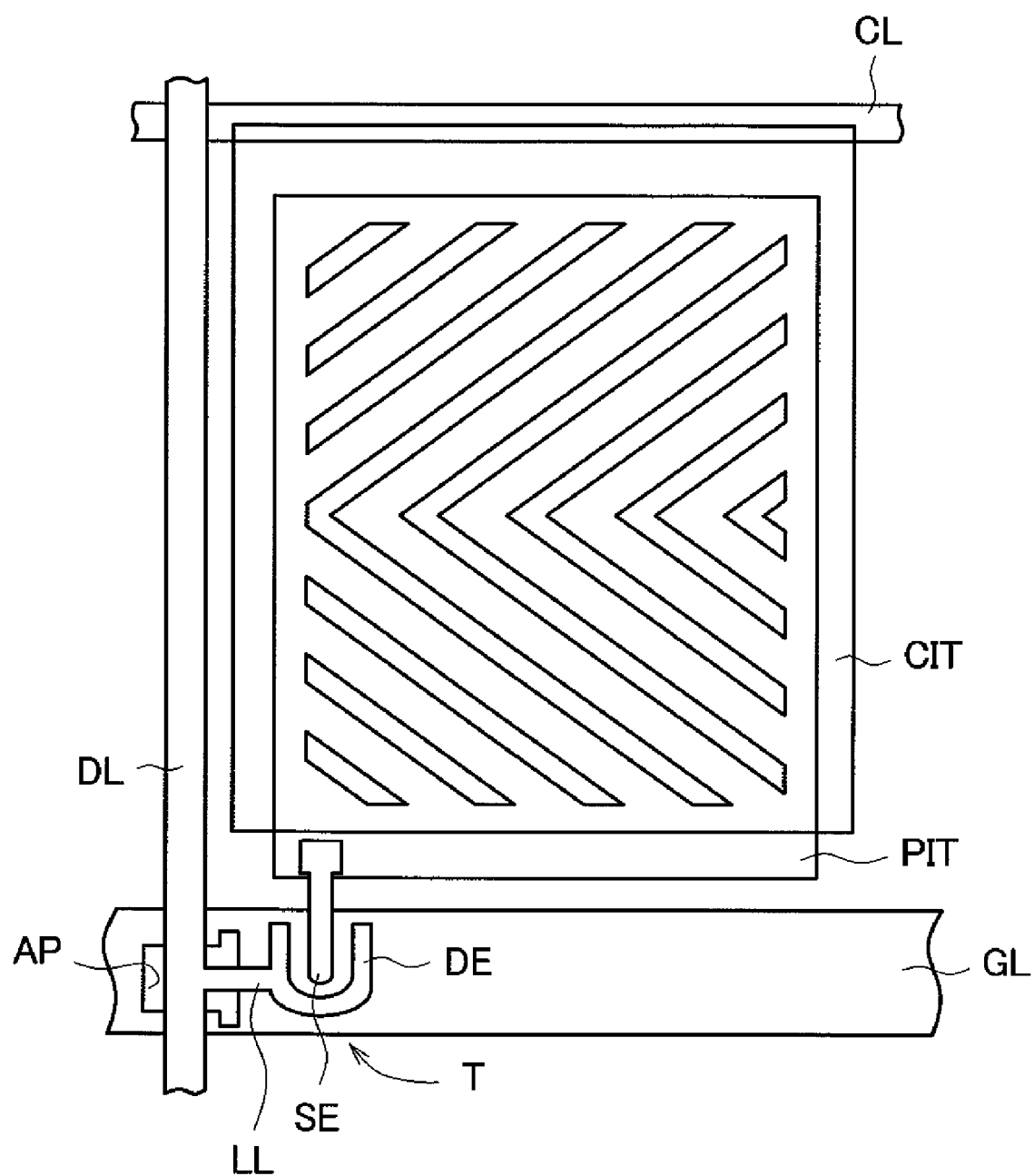
FIG. 3 is a plan view showing a pixel region of the TFT substrate of the display device according to the first embodiment of the present invention.

FIG. 1 is a partial plan view of a TFT substrate TS which shows the positional relationship among the scanning signal line GL, the video signal line DL, and the thin film transistor T mounted on the TFT substrate TS. Further, FIG. 2 is a circuit diagram showing a portion of the circuit constitution of the display device according to this embodiment. FIG. 3 is a plan view showing one pixel region of the TFT substrate. Here, the explanation is made with respect to an example where the display device according to this embodiment is a liquid crystal display device which adopts an IPS (In Plane Switching) method.

As shown in these drawings, a plurality of scanning signal lines GL which are arranged parallel to each other are mounted on the TFT substrate TS. Further, a plurality of video signal lines DL is arranged parallel to each other and, at the same time, when the TFT substrate TS is observed in a plan view, a plurality of video signal lines DL is arranged so as to approximately orthogonally intersect with the plurality of respective scanning signal lines GL. Respective regions surrounded by the scanning signal lines GL and the video signal lines DL which intersect with each other form pixel regions of the display device according to this embodiment.

Further, on each of the plurality of pixel regions which are defined by the scanning signal lines GL and the video signal lines DL on the TFT substrate TS, the thin film transistor T which performs a display control of the pixel is formed. A gate electrode of the thin film transistor T is constituted of a part of the scanning signal lines GL, one of a drain electrode DE and a source electrode SE is connected to the video signal lines DL via a connecting line LL, and the other of the drain electrode DE and the source electrode SE is connected to a pixel electrode PIT. Depending on a voltage applied to the drain electrode DE of the thin film transistor T and the source electrode SE of the thin film transistor T, the roles that these electrodes play are exchanged. In this embodiment, for the sake of convenience, the electrode which is connected to the video signal line DL is set as the drain electrode DE and the electrode which is connected to the pixel electrode PIT is set as the source electrode SE. Further, common electrodes CIT which correspond to respective pixel electrodes PIT of pixels are connected with one of a plurality of common signal lines CL which are arranged parallel to the respective scanning signal lines GL, and a predetermined reference voltage is applied to the respective common signal lines CL. Here, both of the pixel electrode PIT and the common electrode CIT are made of a transparent conductive material such as ITO (Indium Tin Oxide), for example. As shown in FIG. 3, the pixel electrode PIT is formed such that a plurality of strip-shaped regions of the pixel electrode PIT at least partially overlaps with the common electrode CIT as viewed in a plan view.

In the display device of this embodiment, a voltage is selectively applied to the scanning signal line GL for every predetermined timing by a scanning signal line driver circuit not shown in the drawing, and a voltages is selectively applied to the video signal line DL for every predetermined timing by a video signal line driver circuit not shown in the drawing. Due to such selective applying of voltages, an ON/OFF state of the thin film transistor T corresponding to the pixel which becomes an object of a display control is controlled, and a voltage which is applied to the pixel electrode PIT of the pixel which constitutes a display object is controlled via the thin film transistor T. When a voltage applied to the pixel electrode PIT is changed, an electric field generated between the pixel electrode PIT and the common electrode CIT is also changed. The display device of this embodiment performs a display control for every pixel by controlling liquid crystal molecules using a change of an electric field generated between the pixel electrode PIT and the common electrode CIT.

Further, as shown in FIG. 1, at a portion of the scanning signal line GL where the scanning signal line GL and the video signal line DL intersect with each other as viewed in a plan view, an opening portion AP which penetrates the scanning signal line GL is formed such that a portion of the opening portion AP overlaps with the video signal line DL. Here, the opening portion AP has an approximately rectangular shape as a whole. The scanning signal line GL has a midst portion thereof bifurcated or divided in two by the opening portion AP, and the scanning signal line GL intersects the video signal line DL at the portion where the scanning signal line GL is bifurcated. Further, the previously-mentioned connecting line LL is branched from the video signal line DL over the opening portion AP, extends to the outside of the opening portion AP (that is, to a position above the scanning signal line GL), and is connected to the drain electrode DE. A shape of the opening portion AP is explained in detail later.

Figure 4:
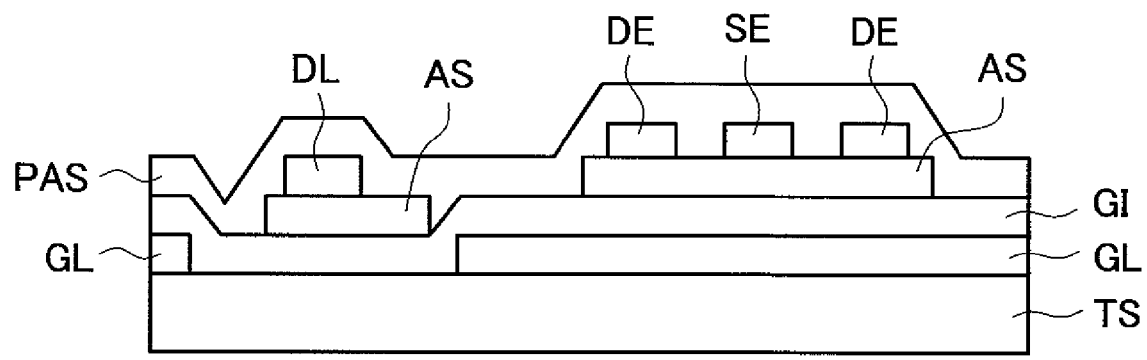
FIG. 4 is a partial cross-sectional view of the TFT substrate of the display device according to the first embodiment of the present invention.
Figure 5:
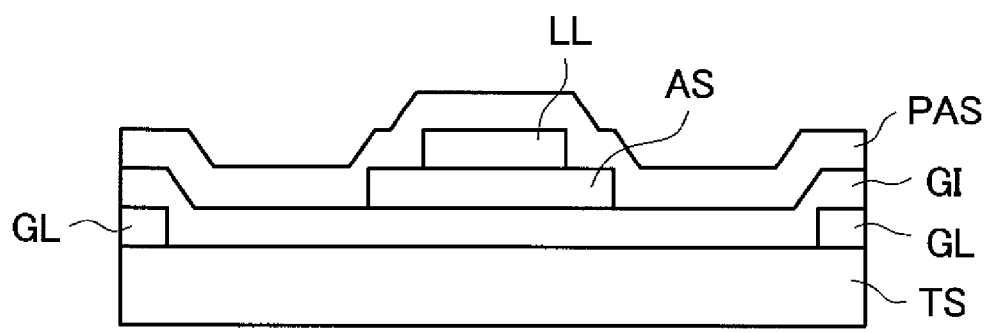
FIG. 5 is a partial cross-sectional view of the TFT substrate of the display device according to the first embodiment of the present invention.

FIG. 4 is a partial cross-sectional view showing a portion of the TFT substrate structure where the scanning signal lines GL are arranged on the TFT substrate TS shown in FIG. 1 (a portion taken along a line IV-IV in FIG. 1) taken along a plane perpendicular to a surface of the substrate and parallel to the direction that the scanning signal lines GL extend. Further, FIG. 5 is a partial cross-sectional view showing a portion of the TFT substrate structure where the opening portion AP formed in the TFT substrate TS shown in FIG. 1 passes (a portion taken along a line V-V in FIG. 1) taken along a plane perpendicular to a surface of the substrate and perpendicular to the direction that the scanning signal lines GL extend. As shown in these drawings, on a TFT substrate TS, the scanning signal lines GL, an insulation film GI, semiconductor layers AS, conductor layers and a protective film PAS are sequentially stacked. Here, the conductor layer is a layer which includes the video signal line DL, the connecting line LL, the drain electrode DE and the source electrode SE. Although not shown in these drawings, the common electrodes CIT and the common signal lines CL are also formed on the TFT substrate TS. Further, the pixel electrodes PIT are formed over the protective film PAS such that the pixel electrodes PIT are connected with the source electrodes SE.

The insulation film GI is a layer which contains a material such as silicon nitride, for example, and is formed so as to cover the scanning signal lines GL, the common electrodes CIT and the common signal lines CL formed on the TFT substrate TS. The insulation film GI functions as a gate insulation film of the thin film transistor T.

The semiconductor layer AS is a layer made of amorphous silicon (a-Si), for example. As shown in FIG. 1, the semiconductor layer AS is formed so as to cover a region of the insulation film GL larger than a region where the conductor layer is formed as viewed in a plan view. A portion of the semiconductor layer AS including a region defined between the drain electrode DE and the source electrode SE functions as a channel layer of the thin film transistor T.

The protective film PAS is formed so as to cover the insulation film GI, the semiconductor layers AS and the respective conductor layers formed on the surface of the TFT substrate TS except for portions of the source electrodes SE which are connected with the pixel electrodes PIT for preventing the direct connection between the thin film transistors T and the liquid crystal material. Further, both of the scanning signal lines GL and the conductor layers are made of a conductive metal material.

In this embodiment, the explanation is made with respect to a method of manufacturing the TFT substrate TS on which layers including the scanning signal lines GL, the insulation film GI, the semiconductor layers AS, the conductor layers, the protective film PAS and the pixel electrodes PIT described above are sequentially stacked in conjunction with FIG. 6A to FIG. 6E. FIG. 6A to FIG. 6E are partial cross-sectional views showing the cross-sectional structure of the TFT substrate TS at the same position as the TFT substrate TS shown in FIG. 4.

Figure 6A:
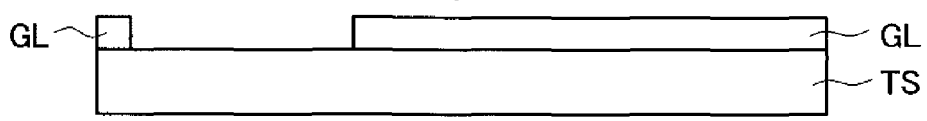
FIG. 6A to FIG. 6E are views for explaining manufacturing steps of the display device according to the first embodiment of the present invention.

First of all, the scanning signal lines GL and the common signal lines CL are formed on a surface of the TFT substrate TS (first step). FIG. 6A shows the cross-sectional structure of the TFT substrate TS at a stage in which the scanning signal lines GL are formed. Here, a specific example of a method of forming the scanning signal lines GL and the common signal lines CL is explained. First of all, a film made of a metal material for forming the scanning signal lines GL and the common signal lines CL is formed on the TFT substrate TS, and a film made of a resist material (photosensitive agent) (hereinafter referred to as a resist film RF) is stacked on the film made of the metal material for forming the scanning signal lines GL and the common signal lines CL. Then, the resist film RF is formed into a pattern which corresponds to objects to be formed by exposure and development, and the scanning signal lines GL and the common signal lines CL are formed by performing etching using the formed resist film RF as a mask. Thereafter, the remaining resist material is peeled off.

Next, after the formation of the scanning signal lines GL and the common signal lines CL on the TFT substrate TS in first step is finished, the insulation film GI is formed on the TFT substrate TS (second step). Due to this second step, the scanning signal lines GL and the common signal lines CL are covered with the insulation film GI.

Subsequently, on the insulation film GI, a film made of a semiconductor material ASM for forming the semiconductor layers AS, a film made of a conductor material CDM for forming the conductor layers and the resist film RF are sequentially stacked (third step).

Figure 6B:
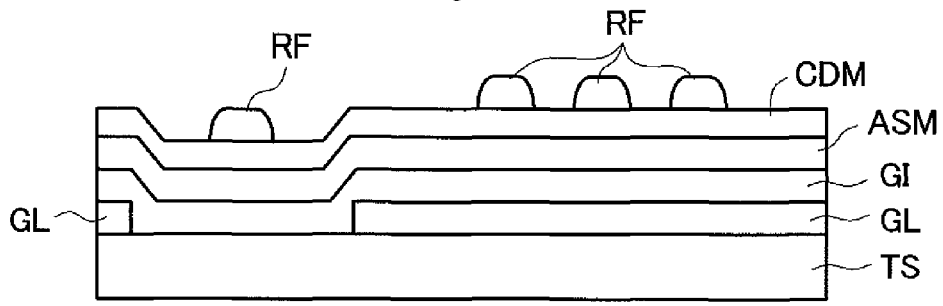
Figure 6C:
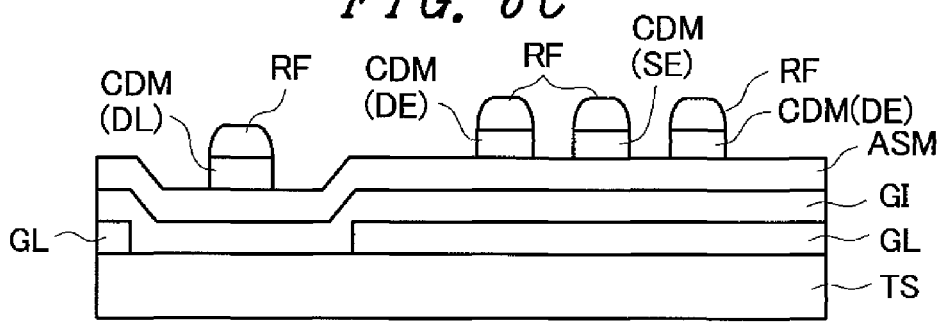

Thereafter, in the same manner as the formation of the scanning signal lines GL, the conductor layer is formed. To be more specific, the resist film RF is exposed using a mask pattern corresponding to a shape of the conductor layer to be formed, and the resist film RF is developed thus forming the resist film RF into a pattern corresponding to the shape of the conductor layer (fourth step). FIG. 6B shows the cross-sectional structure of the TFT substrate TS at this stage. The film made of the conductor material CDM is etched using the formed resist film RF as a mask thus forming the conductor layer which includes the video signal line DL, the connecting line LL, the drain electrode DE and the source electrode SE (fifth step). FIG. 6C shows the cross-sectional structure of the TFT substrate TS at a stage that the fifth step is finished.

Figure 6D:
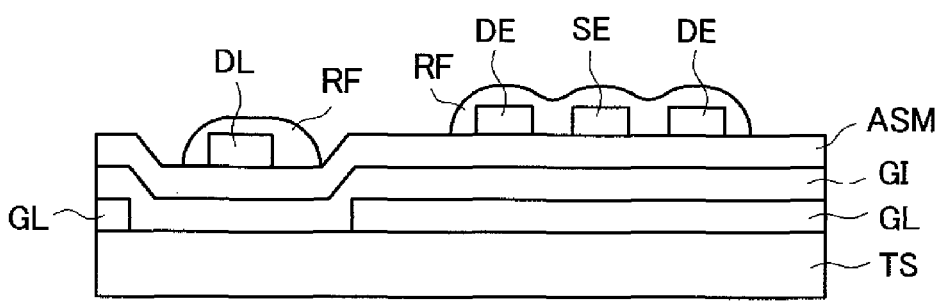

Subsequently, after the TFT substrate TS assumes a state shown in FIG. 6C due to the formation of the conductor layer, a resist reflow in which the resist film RF remaining on the conductor layer is melted by heating is performed (sixth step). Accordingly, when the TFT substrate TS is observed in a plan view, the resist film RF assumes a state in which the resist film RF covers a region which is larger than the region where the conductor layer is formed. FIG. 6D shows the cross-sectional structure of the TFT substrate TS in a state that the resist material is melted.

Figure 6E:
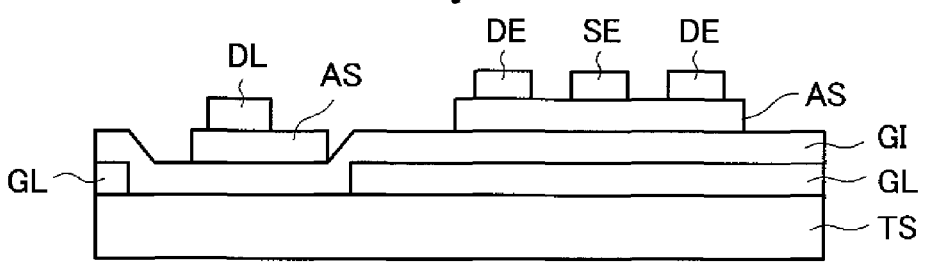

In such a state, the film made of the semiconductor material ASM is etched using the melted resist material as a mask. Thereafter, the remaining resist material is peeled off. Due to such a step, the semiconductor layer AS is formed so as to cover a region of the insulation film GI which is larger than a region where the conductor layer is formed (seventh step). FIG. 6E shows the cross-sectional structure of the TFT substrate TS in a state that steps up to the formation of the semiconductor layer AS are finished.

In sixth step, the resist material spreads due to melting thereof and hence, a width of a region of the semiconductor layer AS which projects from the conductor layer is not uniform because of the influence of a surface tension generated on the resist material or the like. Particularly, as shown in FIG. 1, the resist material is liable to easily gather around the position where the connecting line LL is branched from the video signal line DL and hence, the semiconductor layer AS largely spreads at the portion.

Further, the protective film PAS and the pixel electrodes PIT are formed (eighth step) thus completing the TFT substrate TS on which the scanning signal lines GL, the insulation film GI, the semiconductor layers AS, the conductor layers, the protective film PAS and the pixel electrodes PIT are sequentially stacked.

Next, the shape of the opening portion AP formed in the scanning signal line GL is explained. As mentioned previously, by forming the opening portion AP in the scanning signal line GL, the scanning signal line GL intersects the video signal line DL in a bifurcated manner as viewed in a plan view. Accordingly, when the scanning signal line GL and the video signal line DL are short-circuited with each other at an intersecting portion during the above-mentioned manufacturing process of the TFT substrate TS, by cutting one scanning signal line GL which is short-circuited with the video signal line DL out of these bifurcated or branched scanning signal lines GL on both sides of the video signal line DL, it is possible to cut off the portion of the scanning signal line GL which is short-circuited with the video signal line DL.

Further, in this embodiment, as shown in FIG. 1, the opening portion AP is formed in a projecting manner toward both edges of the scanning signal line GL such that a width of the opening portion AP in the direction which intersects the connecting line LL is set larger than a width of the semiconductor layer AS which spreads to the outside of the connecting line LL at least at a portion of the opening portion AP on a side where the connecting line LL advances into the opening portion AP as viewed in a plan view. That is, on the side where the connecting line LL advances into the opening portion AP, the opening portion AP projects along the direction which extends toward both edges of the scanning signal line GL from a center line of the scanning signal line GL. Due to such constitution, cutoff portions CT1, CT2 are formed in two portions of the scanning signal line GL. Here, both cutoff portions CT1, CT2 form an approximately rectangular region which projects from the approximately rectangular opening portion AP as a whole. At portions where the cutoff portions CT1, CT2 are formed, a width W1 of the opening portion AP in the direction which intersects the connecting line LL (the direction parallel to the video signal line DL in the drawing) is set larger than a width W2 of the semiconductor layer AS in the same direction.

In this manner, the cutoff portions CT1, CT2 are formed such that the cutoff portions CT1, CT2 project toward both edges of the scanning signal line GL exceeding a region in which the resist material remaining on the video signal line DL and the connecting line LL spreads by melting in the above-mentioned sixth step. Accordingly, even when the semiconductor layer AS is formed in an spreading manner at a position where the connecting line LL is branched from the video signal line DL as described before, it is possible to prevent a region of the opening portion AP on the side where the connecting line LL advances into the opening portion AP from being closed by the semiconductor layer AS. That is, as shown in FIG. 1, portions of the opening portion AP where the cutoff portions CT1, CT2 are formed are not covered with the semiconductor layer AS when the TFT substrate TS is viewed in a plan view so that these portions still maintain a predetermined area. Accordingly, when it is necessary to perform the black-spot-forming correction of a pixel, by cutting the connecting line LL and the semiconductor layer AS which extends below the connecting line LL using a laser or the like along a line which connects the inside of the cutoff portion CT1 and the inside of the cutoff portion CT2 within the opening portion AP (that is, a line in the direction which intersects the connecting line LL), the video signal line DL and the thin film transistor T are separated from each other. Further, even when the scanning signal line GL is cut because of the previously-mentioned occurrence of short-circuiting between the video signal line DL and the scanning signal line GL, the scanning signal line GL can be cut from one edge thereof to a position of the cutoff portion CT1 or CT2 which is not covered with the semiconductor layer AS within the opening portion AP.

The opening portion AP which includes the cutoff portions CT1, CT2 explained above can be formed in the previously mentioned first step of the manufacturing process of the TFT substrate TS such that the opening portion AP is formed by using a pattern corresponding to a shape of the scanning signal line GL in which the opening portion AP shown in FIG. 1 is formed as a mask pattern for exposing a resist film RF at the time of forming the scanning signal line GL.

Further, FIG. 1 illustrates the example in which the cutoff portions CT1, CT2 are formed of a rectangular region whose one side extends along the extending direction of the scanning signal line GL. However, provided that the opening portion AP is formed in a projection manner such that the width of the opening portion AP in the direction which intersects the connecting line LL is set larger than the width of the semiconductor layer AS toward both edges of the scanning signal line GL, cutoff portions CT1, CT2 may have any shape besides the above-mentioned shape. As a specific example, FIG. 7 illustrates an example in which distal ends of both cutoff portions CT1, CT2 are formed with inclination toward a side where the thin film transistor T is arranged as viewed in a plan view. In the example shown in the drawing, an end portion of the opening portion AP to which the connecting line LL advances is formed in an arcuate shape having a predetermined width as a whole. Also in this case, in the same manner as the example shown in FIG. 1, the connecting line LL and the semiconductor layer AS which expands below the connecting line LL can be cut within the opening portion AP along a line which connects the inside of the cutoff portion CT1 and the inside of the cutoff portion CT2.

Next, a display device according to the second embodiment of the present invention is explained. The display device according to the second embodiment differs from the display device according to the first embodiment in the shape of the opening portion AP. Due to such difference in the shape of the opening portion AP, the display device according to the second embodiment differs from the display device according to the first embodiment also in a spreading shape of the semiconductor layer AS as viewed in a plan view. However, the second embodiment is substantially equal to the first embodiment with respect to the structure of other parts and the manufacturing method of the display device and hence, their explanation is omitted.

Figure 8:
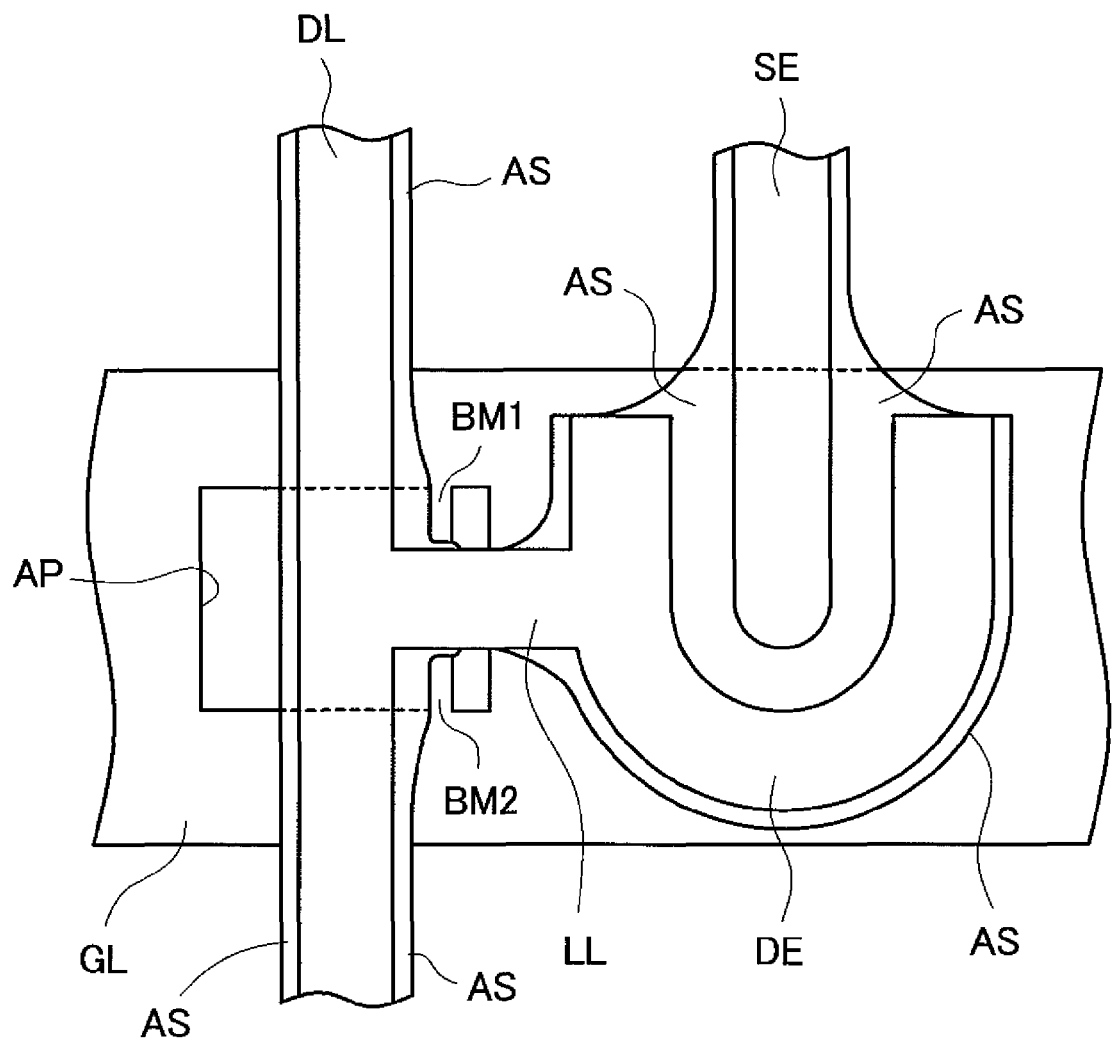
FIG. 8 is a partial plan view of a TFT substrate of a display device according to a second embodiment of the present invention.

FIG. 8 is a partial plan view of a TFT substrate TS of the display device according to the second embodiment in the same manner as FIG. 1 which shows the display device according to the first embodiment. As shown in FIG. 8, in the display device according to this embodiment, within the opening portion AP, the scanning signal line GL includes two projecting portions BM1, BM2 which project in the direction toward a center line of a scanning signal line GL from both edges of the scanning signal line GL. Due to such constitution, the opening portion AP is formed such that a width of the opening portion AP in the direction which intersects a connecting line LL is once narrowed at a portion thereof corresponding to the projecting portions BM1, BM2 and, thereafter, is expanded again corresponding to the increase of a distance from a video signal line DL toward a side where the connecting line LL advances into the opening portion AP as viewed in a plan view.

Figure 9A:
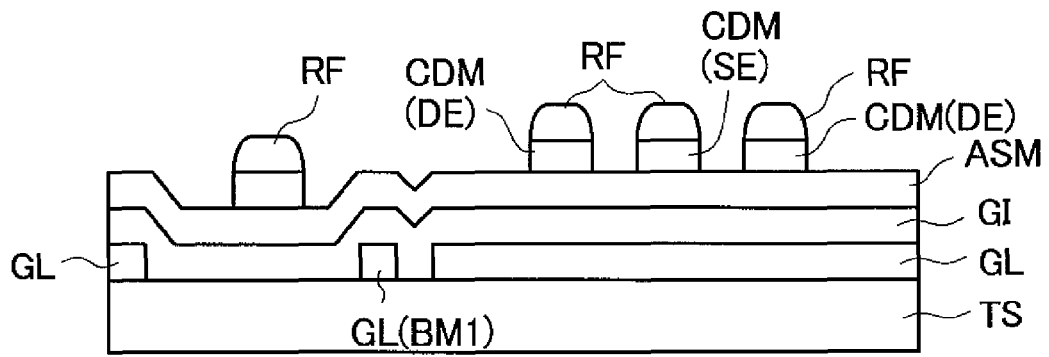
FIG. 9A to FIG. 9C are views for explaining manufacturing steps of the display device according to the second embodiment of the present invention.
Figure 9B:
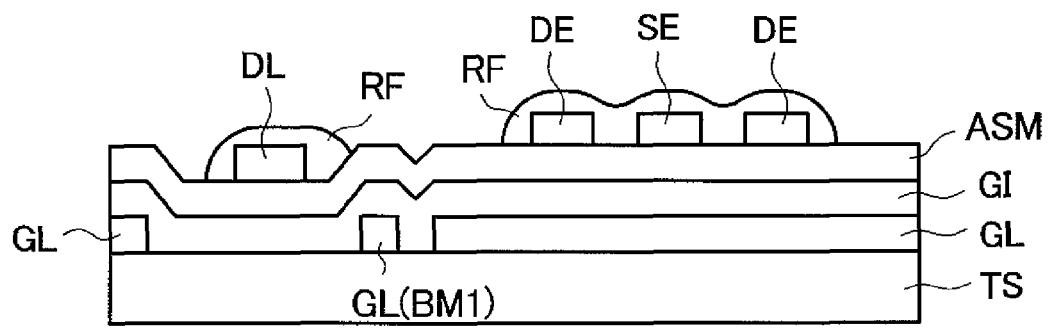
Figure 9C:
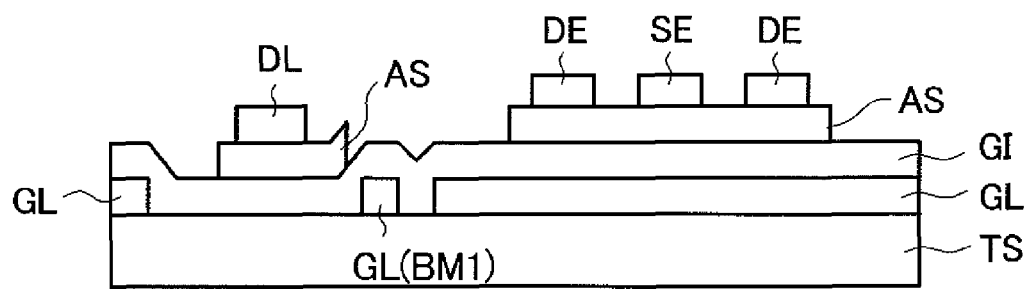

FIG. 9A, FIG. 9B and FIG. 9C show, in the same manner as FIG. 6C, FIG. 6D and FIG. 6E which show the manufacturing step of the display device according to the first embodiment, a cross section of a TFT substrate TS in states which are obtained due to the completion of the above-mentioned fifth step, sixth step and seventh step in a manufacturing process of the display device according to the second embodiment.

As shown in FIG. 9A, different from the step of the first embodiment shown in FIG. 6C, within the opening portion AP over the TFT substrate TS, the projecting portions BM1, BM2 which are made of a metal material for forming the scanning signal lines GL project. Due to such constitution, portions of the TFT substrate TS structure where the projecting portions BM1, BM2 are formed are formed in a raised manner by an amount corresponding to a thickness of the scanning signal line GL compared to portions of the TFT substrate TS structure within the opening portion AP formed around the portions where the projecting portions BM1, BM2 are formed including the insulation film GI.

When resist reflow in a sixth step is performed in a state shown in the drawing, different from the case of the first embodiment, a resist material in a molten state is blocked by the portions of the scanning signal line GL where the projecting portions BM1, BM2 are formed so that the resist material in a molten state spreads no more. That is, a region of the opening portion AP where a width in the direction which intersects the connecting line LL is narrowed due to the projecting portions BM1, BM2 functions as a weir which suppresses spreading of the resist material remaining on the video signal line DL and the connecting line LL at the time of performing resist reflow in a semiconductor layer AS forming step. Accordingly, as shown in FIG. 9B, the resist material assumes a state where the resist material spreads to a position directly in front of a position where the projecting portions BM1, BM2 are formed within the opening portion AP.

By etching the semiconductor material ASM and peeling the resist material in the seventh step in such a state, as shown in FIG. 9C, it is possible to suppress the formation of the semiconductor layer AS in a region positioned remoter than the projecting portions BM1, BM2 within the opening portion AP as viewed from the video signal line DL. Accordingly, as shown in FIG. 8, spreading of the semiconductor layer AS in a plan view at a position where the connecting line LL is branched from the video signal line DL becomes smaller compared to the spreading of the semiconductor layer AS in the example shown in FIG. 1.

In this manner, a region within the opening portion AP on a side opposite to a video-signal-line-DL side of the projecting portions BM1, BM2 (that is, a portion of the opening portion AP which is formed by expanding a width of the opening portion AP which is once narrowed in the direction which intersects the connecting line LL) is not covered with the semiconductor layer AS. Accordingly, in performing the black-point-making correction of a pixel, by cutting the connecting line LL and the semiconductor layer AS which expands below the connecting line LL in such a region, also in this embodiment, in the same manner as the display device according to the first embodiment, it is possible to separate the video signal line DL and the thin film transistor T from each other. Further, even when the video signal line DL and one of two bifurcated scanning signal lines GL are short-circuited to each other, it is possible to perform a repair which separates the scanning signal line GL.

In the second embodiment, the scanning signal line GL which forms the projecting portions BM1, BM2 within the opening portion AP can be formed using a pattern corresponding to a shape of the scanning signal line GL in which the opening portion AP shown in FIG. 8 is formed as a mask pattern for exposing a resist film RF at the time of forming the scanning signal line GL in a first step of a manufacturing process of a TFT substrate TS.

Further, FIG. 8 shows an example in which the projecting portions BM1, BM2 are formed so as to occupy approximately rectangular regions within the approximately rectangular opening portion AP as a whole. However, provided that the opening portion AP is formed such that the width of the opening portion AP in the direction which intersects the connecting line LL is once narrowed and is expanded again thereafter corresponding to the increase of the distance from the video signal line DL toward a side where the connecting line LL advances into the opening portion AP as viewed in a plan view, the projecting portions BM1, BM2 may be formed in any shape besides the shape shown in FIG. 8.

Figure 10:
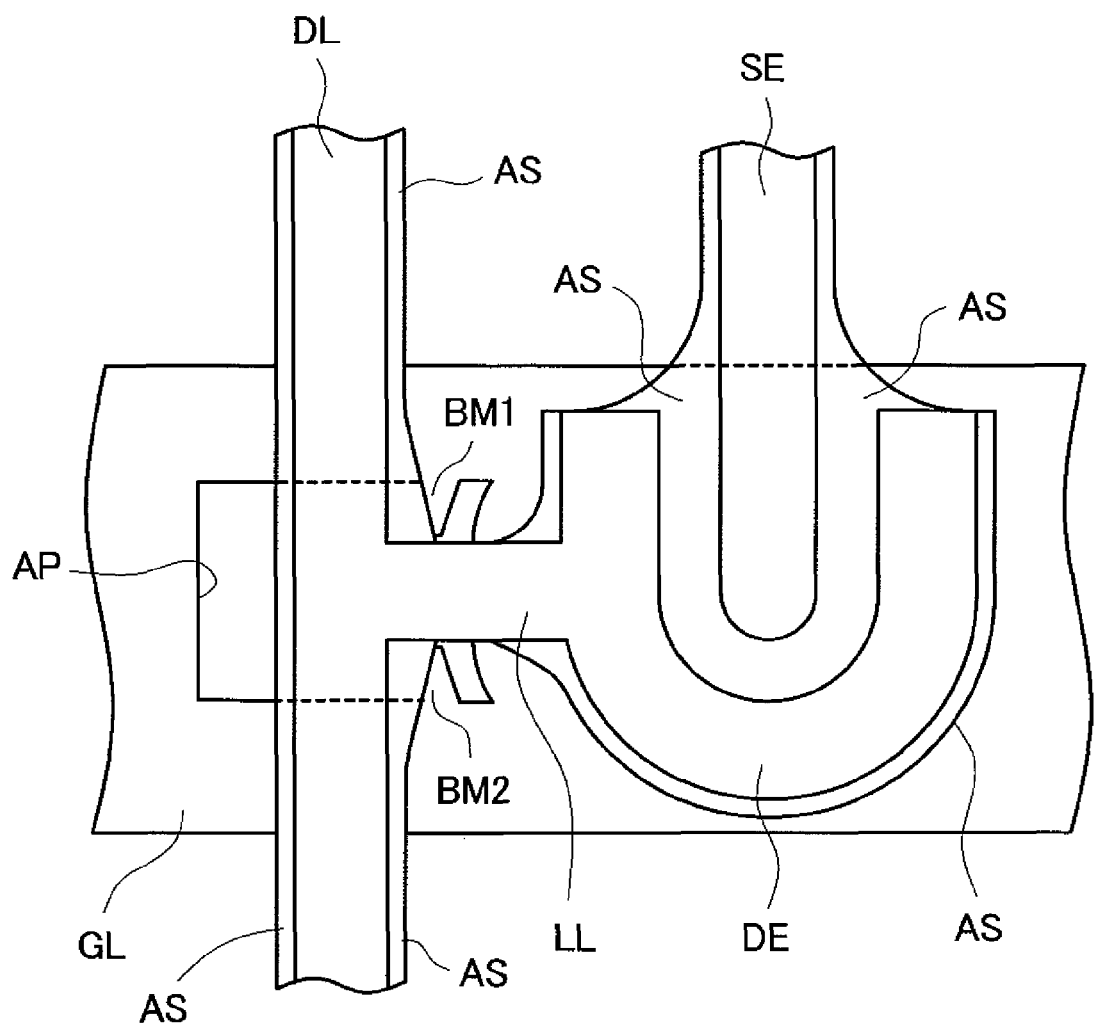
FIG. 10 is a view showing another example of a shape of an opening portion of the display device according to the second embodiment of the present invention.
Figure 11:
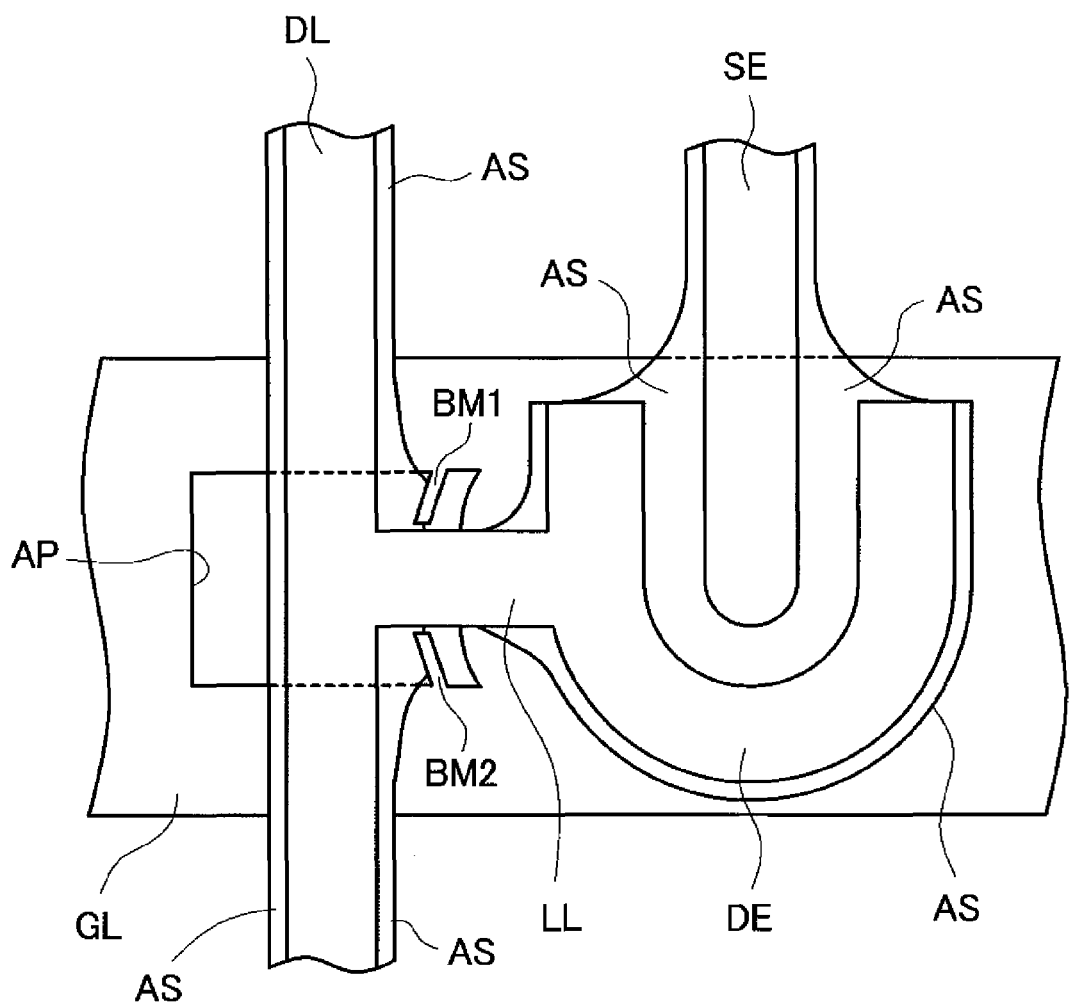
FIG. 11 is a view showing still another example of a shape of an opening portion of the display device according to the second embodiment of the present invention.
Figure 12:
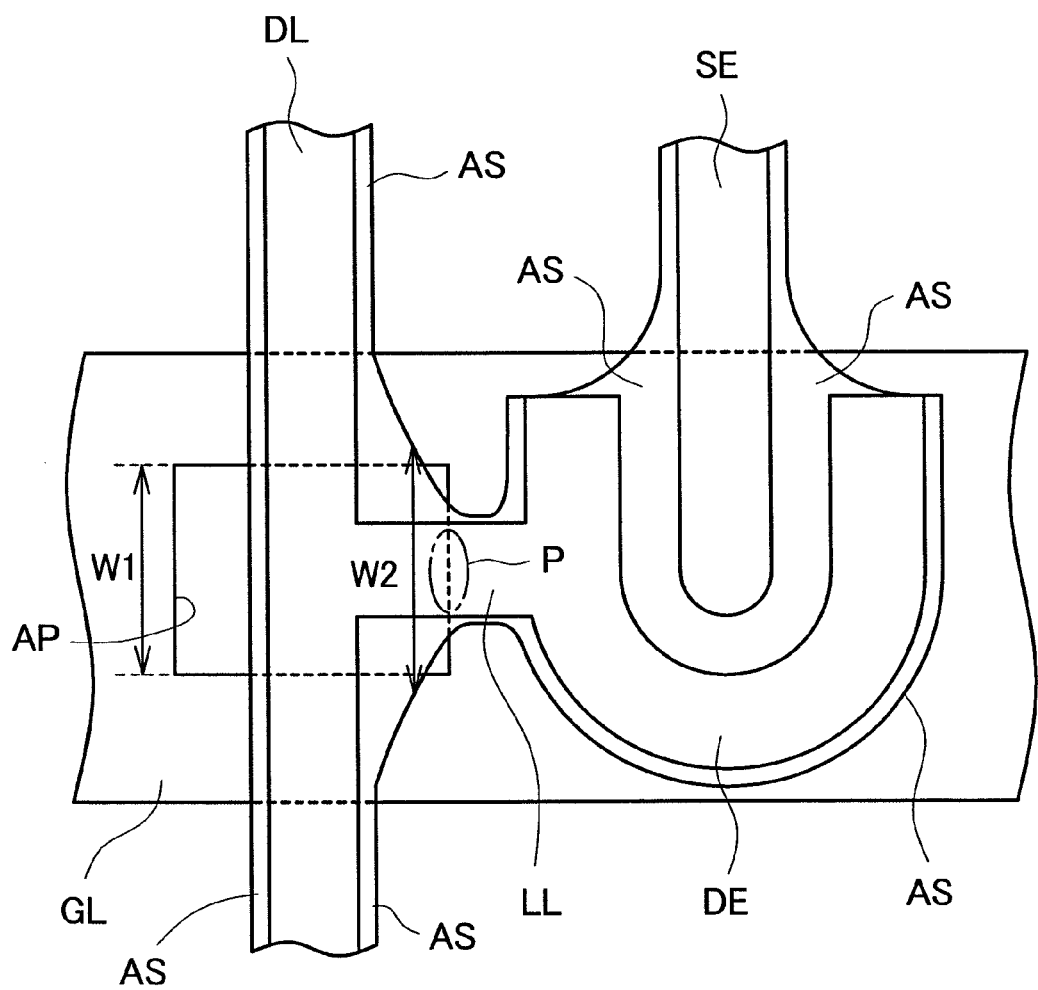
FIG. 12 is a partial plan view of a TFT substrate of a conventional display device.

As a specific example, FIG. 10 shows an example in which an end portion of the opening portion AP on a side where the connecting line LL advances into the opening portion AP is formed in an arcuate shape, and the projecting portions BM1, BM2 are formed in a trapezoidal shape. Further, FIG. 11 an example in which, in the same manner as the opening portion AP shown in FIG. 10, an end portion of an opening portion AP on a side where a connecting line LL advances into the opening portion AP is formed in an arcuate shape, and distal ends of projecting portions BM1, BM2 are formed with inclination toward a video-signal-line-DL side. Also in these examples, in the same manner as the case shown in FIG. 8, spreading of a resist material in the above-mentioned sixth step (resist reflow) can be suppressed by the projecting portions BM1, BM2 and hence, it is possible to prevent a space for cutting the connecting line LL at the time of performing the black-spot-forming correction from being closed by the semiconductor layer AS.

Here, the present invention is not limited to the embodiments explained heretofore. For example, in the explanation made heretofore, the explanation has been made with respect to the case in which the present invention is applied to the so-called IPS-type liquid crystal display device in which both of the pixel electrode PIT and the common electrode CIT are arranged on a TFT substrate TS side in a state that the insulation film GI and the protective film PAS are sandwiched between the pixel electrode PIT and the common electrode CIT, and the liquid crystal molecules are controlled by a lateral electric field generated between both electrodes. However, the present invention is not limited to such an IPS-type liquid crystal display device and is also applicable to a display device which adopts other method. For example, the present invention is also applicable to a so-called VA (Vertical Alignment)-type liquid crystal display device in which liquid crystal molecules are controlled using a vertical electric field generated between a pixel electrode PIT arranged on a TFT-substrate-TS side and a counter electrode arranged on side of a substrate which faces the TFT substrate TS in an opposed manner. Further, the present invention is also applicable to a so-called TN (Twisted Nematic)-type liquid crystal display device. Still further, the display device according to the embodiment of the present invention is not limited to the liquid crystal display device, and may be any kind of display device which can perform a pixel control by the combination of the scanning signal line GL, the video signal line DL and the thin film transistor T. To be more specific, the present invention is also applicable to an organic EL display device or the like.

Further, the opening portion AP formed in the scanning signal line GL which the display device according to the embodiment of the present invention includes may be formed in a shape which is the combination of a shape having the above-mentioned cutoff portions CT1, CT2 in the first embodiment and a shape having the above-mentioned projecting portions BM1, BM2 in the second embodiment. That is, the display device according to the embodiment of the present invention may include the scanning signal line GL in which the opening portion AP is formed, wherein a width of the opening portion AP in the direction which intersects the connecting line LL is once narrowed and is expanded thereafter corresponding to the increase of the distance from the video signal line DL and, at the same time, the opening portion AP projects toward both edges of the scanning signal line GL.

What is claimed is:

1. A display device in which scanning signal lines, an insulation film, a semiconductor layer, and a conductor layer are sequentially stacked on a substrate, wherein
the conductor layer includes a video signal line which intersects the scanning signal line as viewed in plan view, a drain electrode and a source electrode of a thin film transistor, and a connecting line which connects the video signal line and either one of the drain electrode and the source electrode,
the semiconductor layer is formed so as to cover a region of the insulation film which is larger than a region where the conductor layer is formed as viewed in plan view,
an opening portion which partially overlaps with the video signal line as viewed in plan view is formed in the scanning signal line,
the connecting line is branched from the video signal line over the opening portion, and extends to the outside of the opening portion, and
the opening portion is formed in a projecting manner toward both edges of the scanning signal line such that, as viewed in plan view, at least at a portion of the opening portion on a side where the connecting line advances into the opening portion, a width of the opening portion in the direction which intersects the connecting line is set larger than a width of the semiconductor layer which expands toward an outer side of the connecting line, and the width of the opening portion in the direction which intersects the connecting line at the portion of the opening portion is set larger than a width of the opening portion in the direction which intersects the connecting line at a crossing area of the video signal line and the opening portion.

* * * * *